United States Patent [19]

Löfgren et al.

[11] Patent Number: 6,093,253
[45] Date of Patent: Jul. 25, 2000

[54] METHOD AND A DEVICE FOR EPITAXIAL GROWTH OF OBJECTS BY CHEMICAL VAPOR DEPOSITION

[75] Inventors: Peter Löfgren; Chun Yuan Gu, both of Västerås; Christer Hallin, Linköping; Yujing Liu, Västerås, all of Sweden

[73] Assignee: ABB Research Ltd., Zurich, Switzerland

[21] Appl. No.: 09/060,965

[22] Filed: Apr. 16, 1998

[51] Int. Cl.[7] .................................................. C23C 16/00
[52] U.S. Cl. .......................... 118/725; 118/728; 118/715; 117/104
[58] Field of Search .................... 118/725, 715, 118/728

[56] References Cited

U.S. PATENT DOCUMENTS

| | | | |
|---|---|---|---|
| 2,694,651 | 11/1954 | Pawlyk | 117/106 |
| 2,817,311 | 12/1957 | Nack | 118/725 |
| 3,089,788 | 5/1963 | Marinace | 117/227 |
| 3,446,659 | 5/1969 | Wisman et al. | 117/201 |
| 3,632,429 | 1/1972 | Maeda et al. | 117/201 |
| 3,750,620 | 8/1973 | Eversteijn et al. | 118/725 |
| 4,503,807 | 3/1985 | Nakayama et al. | 118/719 |
| 4,533,410 | 8/1985 | Ogura et al. | 148/175 |
| 4,747,367 | 5/1988 | Posa | 118/715 |
| 4,780,174 | 10/1988 | Lan et al. | 156/610 |
| 4,901,670 | 2/1990 | Ahlgren | 118/728 |
| 4,911,102 | 3/1990 | Manabe et al. | 118/719 |
| 5,259,883 | 11/1993 | Yamabe et al. | 118/725 |
| 5,695,567 | 12/1997 | Kordina et al. | 118/725 |
| 5,704,985 | 1/1998 | Kordina et al. | 118/725 |
| 5,879,462 | 3/1999 | Kordina et al. | 118/725 |

FOREIGN PATENT DOCUMENTS

| | | |
|---|---|---|
| 0068839 | 1/1983 | European Pat. Off. . |
| 0 147 967 | of 1985 | European Pat. Off. . |

OTHER PUBLICATIONS

Nordell et al., Design and Performance of a New Reactor for Vapor Phase Epitaxy of 3C, 6H and 4H SiC, J. Electrochem. Soc., vol. 143, No. 9, 1996, pp. 2910–2919.

Susceptor for Crystal Growth, 1–320292, Mitsubishi Electric Corp; Tomako Kadowaki, vol. 14, No. 123 (C–698), 1989.

Vapor–Phase Epitaxial Growth System, 61–205695, Sumitomo Electric Ind. Ltd.; Masahiro Maeda, vol. 11, No. 43, (C–402) (2490), 1986.

*Primary Examiner*—Jeffrie R Lund
*Attorney, Agent, or Firm*—Pollock, Vande Sande & Amernick, R.L.L.P.

[57] ABSTRACT

A device for epitaxial growth of objects by Chemical Vapor Deposition on a substrate comprises a susceptor adapted to receive the substrate and members for heating walls of the susceptor surrounding the substrate and thereby the substrate and a gas mixture fed to the substrate for the growth. The device comprises also members for holding the substrate in the path of the gas mixture through the susceptor at a distance from internal walls thereof.

20 Claims, 2 Drawing Sheets

METHOD AND A DEVICE FOR EPITAXIAL GROWTH OF OBJECTS BY CHEMICAL VAPOR DEPOSITION

BACKGROUND OF THE INVENTION

The present invention relates to a device for epitaxial growth of objects by Chemical Vapor Deposition on a substrate comprising a susceptor adapted to receive the substrate and means for heating walls of the susceptor surrounding the substrate and thereby that the substrate and a gas mixture fed to the substrate for the growth. The invention also relates to method for epitaxial growth of objects.

The objects may be of any material, but the invention is primarily, but not exclusively, directed to the growth of crystals of semiconductor materials, such as in particular SiC and group III-nitrides or alloys thereof. One of the main problems in such devices for Chemical Vapour Deposition (CVD) is to obtain such a high growth rate that the objects grown would be commercially viable. This problem is especially accentuated for the mentioned materials, which requires a very high temperature for growth, and it has been necessary to raise the temperature even more to obtain higher growth rates.

As a consequence of this, and because SiC is a very desirable material for use in semiconductor devices, the growth of crystals of SiC will hereinafter primarily be discussed for illustration, but in no way restricting the invention. It is of course also of crucial importance that the objects grown have a high crystalline quality. This invention is primarily directed to obtaining reasonable growth rates from the commercial point of view, but of course without compromising the crystalline quality.

SiC single crystals are grown in particular for use in different types of semiconductor devices, such as for example different types of diodes, transistors and thyristors, intended for applications in which it is possible to benefit from the superior properties of SiC in comparison with especially Si, namely the capability of SiC to work well under extreme conditions. For instance, the large band gap between the valence band and the conduction band of SiC makes devices fabricated from this material able to operate at high temperatures, namely up to 10000° K.

As indicated above, it has been tried to raise the temperatures to which the susceptor and thus the gas mixture fed to the substrate and the substrate are heated above 2000° C. for obtaining reasonably high growth rates. This has also partially been successful, but the very high temperatures are of course associated with several problems, some of which are the temperature resistance of the material of different parts of the device and introduction of impurities.

Other ways to increase the growth rate without any reduction in quality are therefore very desired, especially if they could be combined with other measures increasing the growth rate, such as the use of high temperatures for obtaining a still higher growth rate. Accordingly, a device and a method enabling this would have a large commercial impact.

SUMMARY OF THE INVENTION

The object of the present invention is to provide a method and a device according to the introduction, which makes it possible to increase the growth rate when growing objects by CVD without a reduction in quality.

This object is obtained by providing a device which comprises means for holding the substrate in the path of the gas mixture through the susceptor at a distance from internal walls thereof and a method in which the substrate is held in the path of the gas mixture through the susceptor at a distance from internal walls thereof.

Accordingly, the inventors have realized that one important parameter upon which the growth rate depends is the thickness of a boundary layer at the substrate, and this boundary layer is a layer of the flow of the gas mixture in which the velocity thereof is lower than in the central part of the susceptor. The leading edge of the susceptor at the upstream end thereof creates such a boundary layer, and it is shown for a prior art device in FIG. 1 how this boundary layer 1 looks like. The diffusion of species from the free stream above the boundary layer is important for the growth. This diffusion generally depends on the squared diffusive length 2. However, it is not possible to arrange the substrate 3 directly at the leading edge 4 of the susceptor 5, since the gas mixture has to be heated to a desired temperature before reaching the substrate. This gas mixture is heated by radiative heating from the susceptor walls. The walls are heated by a heating means 6 surrounding the susceptor, here an Rf-field generating coil. Accordingly, the substrate has to be placed at a substantial distance downstream the leading edge 4, which in the prior art devices results in a considerable diffusive length 2.

Accordingly, the invention is based on moving the substrate away from the internal walls of the susceptor, so that the influence of the boundary layer 1 created by the leading edge 4 of the susceptor may be reduced or totally eliminated if the distance is large enough. This means that the diffusive length of species from the free stream of the gas mixture to the surface of the substrate is substantially reduced and as a result a large increase in the growth rate is obtained.

According to a preferred embodiment of the invention the means is arranged to hold the substrate separated from the internal walls of the susceptor by at least a distance corresponding to the thickness of a boundary layer with a lower velocity of the gas mixture and created by a leading edge of the susceptor at the upstream end thereof with respect to the flow of the gas mixture through the susceptor. It is preferred to hold the substrate that much separated from the internal walls of the susceptor, since the boundary layer created by the leading edge of the susceptor will then not at all produce any diffusive length from the free stream of the gas mixture to the substrate, but any boundary layer next to the substrate will then only depend on the distance between the leading edge of the holding means and the substrate, and this distance can be made as short as desired.

According to another preferred embodiment of the invention the holding means comprises a plate, on which at least two substrates are arranged in series along the gas mixture flow path at the distance from internal walls of the susceptor. Such an arrangement in series in the direction of the gas mixture flow will of course also increase the growth rate in the sense that more objects may be grown at the same time. This is made possible thanks to the fact that the plate is held at a distance from the internal walls of the susceptor, so that the plate and thus the substrate is no longer in contact with the walls and will only be heated therethrough by radiative heating and as a result the temperature gradient in the flow direction inside the susceptor will that remarkably decreased. This means a substantially uniform temperature will be obtained over a considerable distance in the flow direction in the susceptor, so that two objects grown in this way in series will have substantially the same growth conditions and therefore substantially the same quality.

According to another preferred embodiment of the invention the susceptor is arranged with the path extending substantially horizontally therethrough, and the device comprises two holding means, one connected to a ceiling of the susceptor for holding a substrate at the distance therefrom and another connected to the bottom of the susceptor for holding another substrate at the distance therefrom. This means that the production capacity of the device will be doubled as compared to only one substrate being arranged at the bottom of the susceptor in devices previously known, so that it may be said that the growth rate is increased.

According to another preferred embodiment of the invention the means is arranged to hold the substrate inclined with respect to the path of the flow of the gas mixture through the susceptor, so that a perpendicular to the surface of the substrate has a component in the direction opposite to the direction of the flow. It has turned out that such an inclination of the substrate results in optimal growth conditions and also increases the growth rate.

According to another preferred embodiment of the invention the susceptor is at a downstream end thereof prolonged by an outlet substantially beyond the end of the heating means. This means that the temperature gradient in the flowing direction in the susceptor will be decreased, so that several substrates may be arranged in series in that direction while still obtaining a uniform growth. This also, in the case of inductive heating, results in a displacement of the end effect and its eddy current flow to the rear part of the outlet instead of the rear part of the susceptor, which is favorable for the temperature distribution inside the susceptor.

According to another preferred embodiment of the invention at least one heat shield is arranged downstream of an outlet of the susceptor for the flow of gases for reflecting thermal energy back towards the susceptor. Also, this inventive feature reduces the temperature gradient inside the susceptor. More exactly the temperature is nearly not falling at all from the mid region of the susceptor to the outlet, so that it will be possible to arrange a number of substrates in series inside the susceptor and grow objects thereon under substantially the same conditions.

According to another preferred embodiment of the invention the device has an inlet connected to the upstream end of the susceptor and formed by converging walls guiding the gas mixture into the susceptor, which will improve the flow pattern of the gas mixture in the susceptor.

The advantages of the different embodiments of the method according to the invention appear from the discussion above of the different embodiments of the device according to the invention.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS

Figure 1:
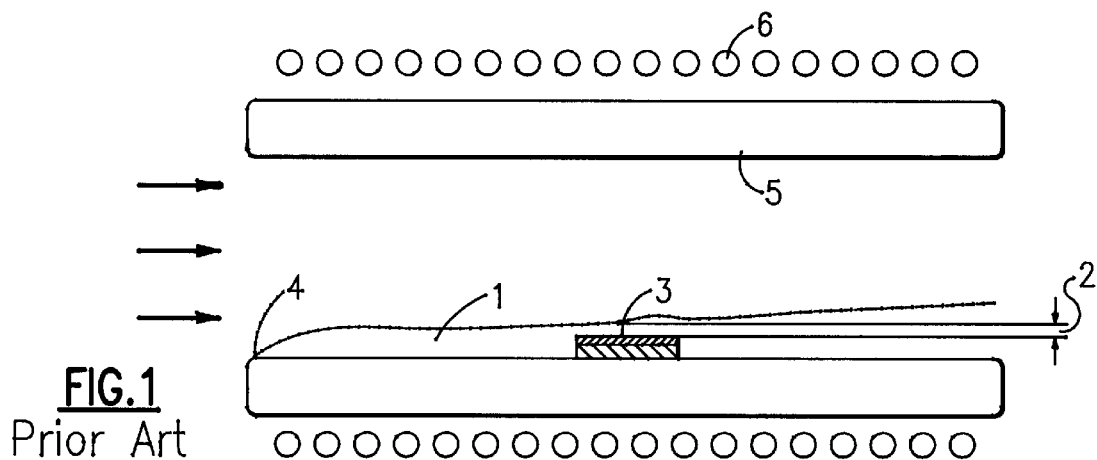
FIG. 1 is a longitudinal cross-section view of a device according to the prior art.
Figure 2:
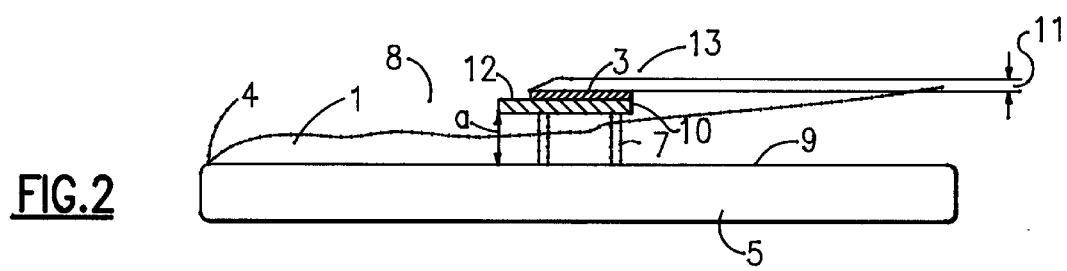
FIG. 2 is a view similar to FIG. 1 of a part of a device according to a first preferred embodiment of the invention.

FIG. 2 shows schematically a part of a device according to a preferred embodiment of the invention for epitaxially growing objects, in the following description by way of example referred to as SiC, by a method according to a preferred embodiment of the invention. It is obvious that the device also comprises many other means, such as pumps, but conventional equipment having nothing to do with the invention has been omitted for the sake of clarity and concentration on the inventive characteristics. The only difference between this device and the prior art device according to FIG. 1 is that the substrate 3 in the device according to the invention is arranged in different way inside the susceptor than in FIG. 1. More exactly, the device has means 7 for holding the substrate in the path 8 of the gas mixture through the susceptor at a distance away from internal walls 9 of the susceptor, in this case the bottom thereof. This holding means are here four graphite screws, one in each corner of a plate 10, preferably of SiC, on which the substrate 3 is arranged. Two elongated ribs of graphite extending in the flowing distribution may carry the plate instead of the screws. The Sic-plate 10 is therefor preventing etching of the rear side of the substrate.

The holding means are arranged to hold the substrate separated from the internal walls 9 by distance "a" exceeding the thickness of a boundary layer 1 formed by the leading edge 4 of the susceptor. This means that the thickness 11 of the boundary layer over the substrate will now only depend on the distance between the leading edge 12 of the plate 10 and the substrate 3. As already said, this distance can be made as short as wanted, so that the diffusive length from the free flow of species through the susceptor may be reduced considerably and by that the growth rate increases correspondingly.

In the case of growing crystals of Sic it will be preferred to form the gas mixture of silane and propane as well as a carrier gas, such as Ar, $H_2$ or He. The heating means 6 will heat the susceptor to a temperature being high enough for cracking of the silane and propane when heated through the susceptor walls for forming Si and C depositing on the surface of the SiC crystal epitaxially grown. This means typically temperatures above 1400° C., and preferably above 1600° C.

The substrate 3 is arranged in the mid region 13 of the susceptor with respect to the path, and it is difficult to arrange it further upstream in the susceptor, since the precursors have to be heated enough before they reach the substrate 3.

Another important advantage of separating the substrate 3 from the internal walls of the susceptor, so that it will have substantially no contact with the walls (except from the holding means 7) is that the back growth on the rear side of the SiC-plate 10 is reduced, since there is no longer such a large temperature difference between the front and rear side of the plate.

Figure 3:
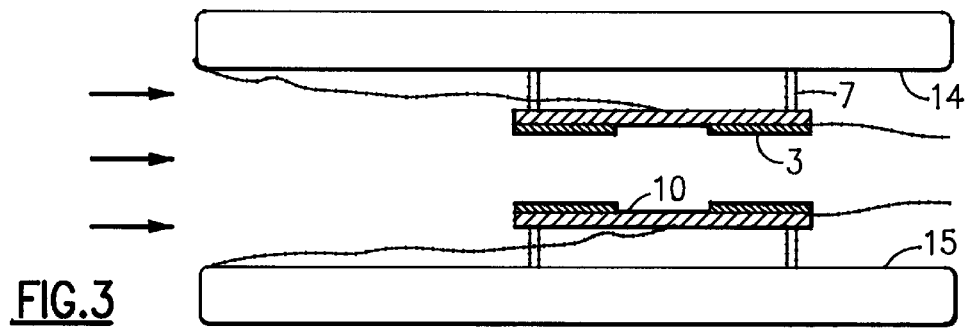
FIG. 3 is a view similar to FIG. 2 of a device according to a second preferred embodiment of the invention.

A device according to a second preferred embodiment of the invention is shown in FIG. 3, and this has two holding means 7, one connected to a ceiling 14 of the susceptor for holding substrates 3 at the distance therefrom and another connected to the bottom 15 of the susceptor for holding other substrates at the distance therefrom. In this case two substrates are arranged in series along the gas mixture flow path, and this is made possible, since the temperature gradient in the flowing direction will be substantially decreased due to the fact that heat energy is substantially only transferred to the plates and the substrates through radiation. Accordingly, approximately the same temperature will prevail for the substrates arranged in series on a plate, so that objects may be grown thereon under substantially identical conditions. This embodiment means that layers of SiC may be grown at a much higher production rate than before, as a consequence of both a considerable reduction of the diffusive length and more substrates at the same time in the susceptor. More exactly, it has turned out that the growth rate depending on the shorter diffusive length may be considerably increased. At the same time, it may be possible to arrange for instance 2×2 substrates on the upper plate and just as many on the lower plate, so that the production rate will increase further.

Figure 4:
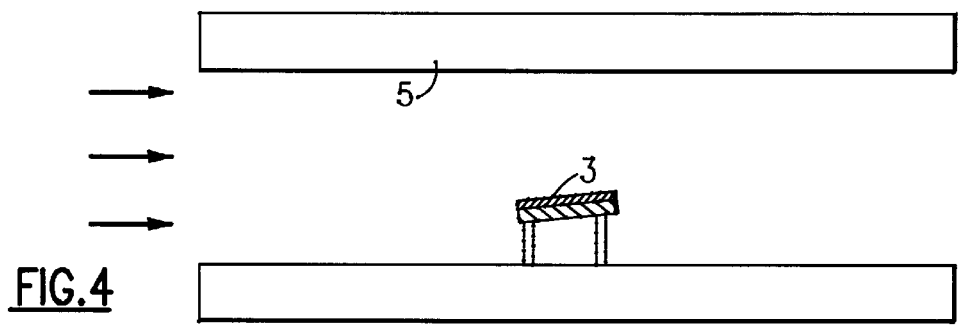
FIG. 4 is a view similar to FIG. 2, of a device according to a third preferred embodiment of the invention.

A device according to a third preferred embodiment is shown in FIG. 4, and this embodiment differs from that shown in FIG. 2 by the fact that the holding means is arranged to hold the substrate 3 inclined with respect to the path of the flow of the gas mixture through the susceptor, so that a perpendicular to the surface of the substrate has a component in the direction opposite to the direction of the flow. The angle made by the surface of the substrate 3 with the direction of the flow is small, preferably 1–15°. This results in optimal conditions for the growth.

Figure 5:
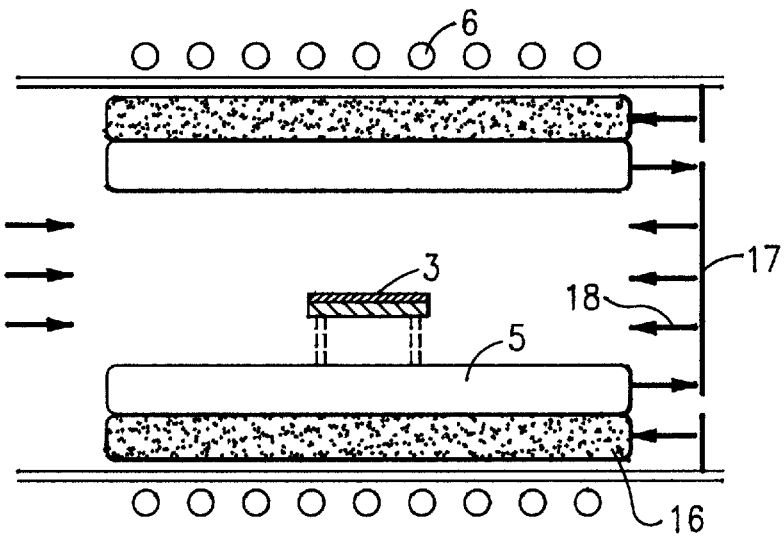
FIG. 5 is a view similar to FIG. 2 of a device according to a fourth preferred embodiment of the invention.

A device according to a fourth preferred embodiment of the invention is schematically shown in FIG. 5. It is here illustrated how the walls of the susceptor 5 of dense graphite are surrounded by a heat-insulating layer 16 of foam. Some heat shields 17 are arranged downstream of the outlet of the susceptor for the flow of gases for reflecting thermal energy back towards the susceptor, which is indicated by the arrows 18. The hottest point in a conventional susceptor is located just in the mid region of the susceptor. After this position the temperature decreases. The temperature decrease is caused by thermal conduction. In the device according to FIG. 5 the outlet/end wall exchanges energy with the surrounding by radiation. Because radiated energy is proportional to temperature to the fourth power, the contribution from the surrounding is negligible. The heat shield will find a temperature much closer to the outlet/end wall, and the radiative energy from the shield towards the susceptor will not be negligible, so that the energy will be "trapped" inside the shield. This means that it is possible to grow objects also in the end region of the susceptor under substantially the same temperature conditions as in the mid region, so that a possible growth region is extended and more objects may be grown simultaneously thus increasing the production rate of the device.

Figure 6:
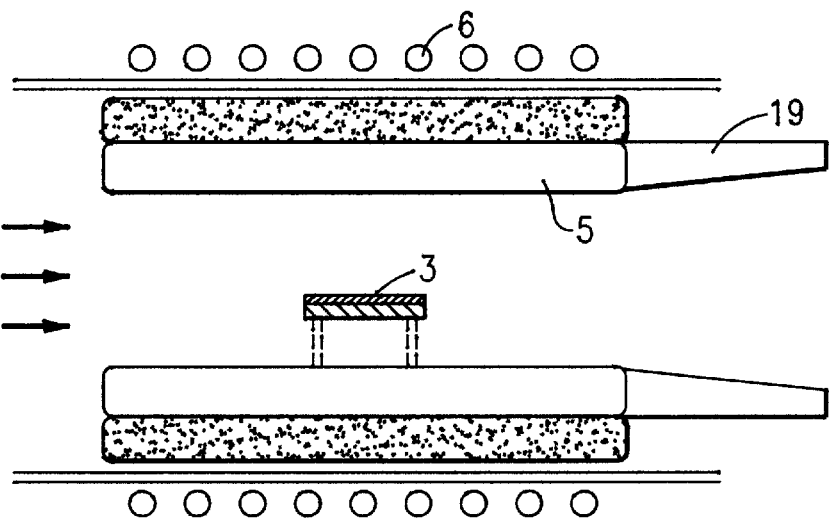
FIG. 6 is a view similar to FIG. 2 of a device according to a fifth preferred embodiment of the invention.

A device according to a fifth preferred embodiment of the invention is illustrated in FIG. 6, and this embodiment differs from those already shown by the fact that the susceptor 5 is at a downstream end thereof prolonged by an outlet 19 substantially beyond the end of the heating means 6. This means that the heat loss from the susceptor is decreased, because the outlet will insulate the susceptor from the cooling flow and the thermal radiation losses, but also due to the fact that the outlet 19 will be heated by the coil. Furthermore, the end effect and its eddy current flow is moved to the rear part of the outlet instead of the rear part of the susceptor. Finally, the outlet will work as a diffuser which will cause better flow conditions for the hot flow that leaves the susceptor. Accordingly, it will be possible to increase the number of objects grown in the susceptor without changing the susceptor geometry.

Figure 7:
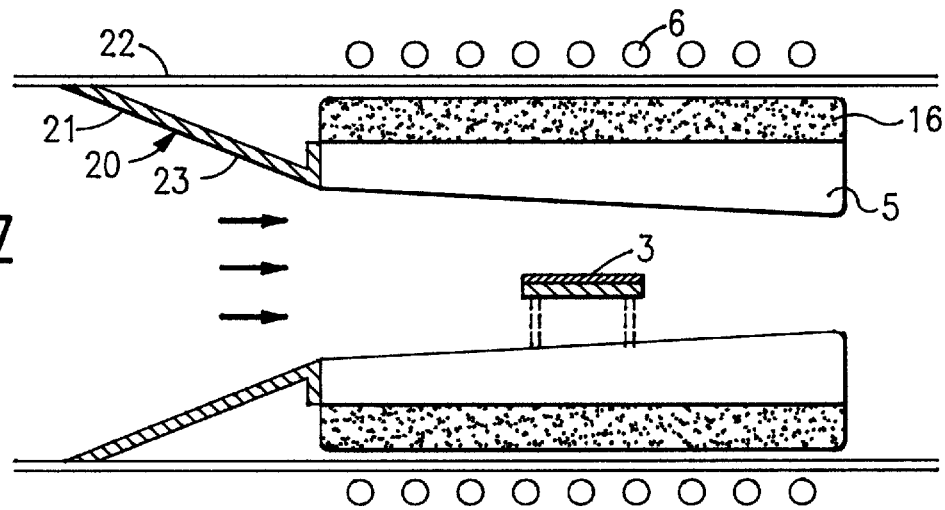
FIG. 7 is a view similar to FIG. 2 of a device according to a sixth preferred embodiment of the invention.

A device according to a sixth preferred embodiment of the invention is shown in FIG. 7, and this differs from that shown in FIG. 5 by the fact that the internal walls 5 are inclined, so that the same effect as in the embodiment according to FIG. 4 is obtained, and that a funnel-like inlet 20 converging in the direction towards the susceptor and conducting the gas mixture into the susceptor is arranged. The inlet 20 has a first part 21 of quartz extending from the outer quartz tube 22 surrounding the susceptor and a second part 23 of graphite connecting to the susceptor. The funnel is circular with the same diameter as the quartz tube 22 at one end and rectangular with the same dimensions as the susceptor inlet hole at the other end. This funnel will improve the flow pattern of the gas mixture, insulate the susceptor from the cooling gas and will instead pre-heat the gas before it enters the susceptor more efficiently, insulate the susceptor from the radiative losses and shield off the gas flow from the rigid graphite insulation 16 and thereby decrease the amount of impurities coming therefrom. The inlet funnel is made of two different materials, because it is very hard (or impossible) to machine the whole in graphite.

The invention is of course not in any way restricted to the preferred embodiments of the device and method described above, but several possibilities to modifications thereof would be apparent for a man with ordinary skill in the art without departing from the basic idea of the invention.

The definition "object" in the claims is to include the epitaxial growth of all types of crystals, such as layers of different thicknesses as well as thick boules.

All definitions concerning the material of course also include inevitable impurities as well as intentional doping. The holding means may have another appearance or be made of another material than described above.

The relative dimensions of the distance between opposite susceptor walls, the distance between the substrate and the susceptor walls etc. may be totally different than shown in the figures.

What is claimed is:

1. A device for epitaxial growth of objects by Chemical Vapor Deposition on a substrate comprising a susceptor adapted to receive said substrate, means for heating walls of the susceptor surrounding the substrate and thereby the substrate and a gas mixture fed to the substrate for the growth, and means for holding the substrate in the path of said gas mixture flow through the susceptor, said holding means placing said substrate at a distance from internal walls of the susceptor so that there is a gas space between the substrate and the internal walls, and wherein the growth surface of the substrate extends substantially in the direction of the gas mixture flow.

2. A device according to claim 1, wherein said holding means holds the substrate separated from said internal walls of the susceptor by at least a distance corresponding to the thickness of a boundary layer with a lower velocity of the gas mixture and created by a leading edge of the susceptor at the upstream end thereof with respect to the flow of the gas mixture through the susceptor.

3. A device according to claim 1, wherein said holding means comprises a plate of SiC, on which the substrate is arranged and said gas space extends between said internal walls and said plate.

4. A device according to claim 1, wherein said holding means comprises a plate adapted to support at least two substrates arranged in series along said gas mixture flow path, said plate being at said distance from internal walls of the susceptor.

5. A device according to claim 1, wherein the susceptor has said gas mixture flow path extending substantially horizontally therethrough, said device comprising two holding means one connected to a ceiling of the susceptor for holding a substrate at said distance therefrom and another connected to a bottom of the susceptor for holding another substrate at said distance therefrom.

6. A device according to claim 1, wherein said holding means holds the substrate in the mid region of the susceptor with respect to said gas mixture flow path between an inlet and an outlet thereof.

7. A device according to claim 1, wherein said holding means holds the substrate inclined with respect to the path of the flow of said gas mixture through the susceptor, so that a perpendicular to the surface of the substrate has a component in the direction opposite of the direction of the flow.

8. A device according to claim 1, wherein the susceptor is located at a downstream end thereof prolonged by an outlet substantially beyond the end of the heating means.

9. A device according to claim 1, wherein at least one heat shield is arranged downstream an outlet of the susceptor for said flow of gases for reflecting thermal energy back towards the susceptor.

10. A device according to claim 1, further comprising an inlet connected to the upstream end of the susceptor and formed by converging walls for guiding said gas mixture into the susceptor.

11. A device according to claim 1, wherein the walls of the susceptor are made of dense graphite.

12. A device according to claim 1, wherein the heating means is to radiate a Rf-field.

13. A device according to claim 11, adapted for the growth of an object of SiC, a group III-nitride or alloys of either SiC and one or more group III-nitrides or two or more group III-nitrides.

14. A device according to claim 1, wherein said heating means heats the susceptor and thereby said substrate and gas mixture to a temperature of about 1400° C.

15. A device for epitaxial growth of objects by Chemical Vapor Deposition on a substrate comprising a susceptor adapted to receive said substrate, means for heating walls of the susceptor surrounding the substrate and thereby the substrate and a gas mixture fed to the substrate for the growth, and means for holding the substrate in the path of said gas mixture flow through the susceptor at said means placing said substrate a distance from internal walls of the susceptor so that there is a space between the substrate and the internal walls, wherein the growth surface of the substrate extends substantially in the direction of the gas mixture flow and wherein said susceptor is substantially completely open on the inlet side thereof.

16. A device according to claim 15, wherein said holding means comprises a plate of SiC, on which the substrate is arranged and said gas space extends between said internal walls and said plate.

17. A device according to claim 15, wherein said holding means comprises a plate adapted to support at least two substrates arranged in series along said gas mixture flow path, said plate being at said distance from said internal walls of the susceptor.

18. A device according to claim 15, wherein the susceptor has said gas mixture flow path extending substantially horizontally therethrough, said device comprising two holding means one connected to a ceiling of the susceptor for holding a substrate at said distance therefrom and another connected to a bottom of the susceptor for holding another substrate at said distance therefrom.

19. A device according to claim 15, wherein said holding means holds the substrate separated from said internal walls of the susceptor by at least a distance corresponding to the thickness of a boundary layer with a lower velocity of the gas mixture and created by a leading edge of the susceptor at the upstream end thereof with respect to the flow of the gas mixture through the susceptor.

20. A device according to claim 15, further comprising an inlet connected to the upstream end of the susceptor and formed by converging walls for guiding said gas mixture into the susceptor.

* * * * *